United States Patent [19]

McLaughlin

[11] Patent Number: 5,373,137
[45] Date of Patent: Dec. 13, 1994

[54] MULTIPLE-LINE LASER WRITING APPARATUS AND METHOD

[75] Inventor: Joseph L. McLaughlin, Marblehead, Mass.

[73] Assignee: Litton Systems, Inc., Lexington, Mass.

[21] Appl. No.: 188,476

[22] Filed: Jan. 28, 1994

[51] Int. Cl.$^5$ .............................................. B23K 26/00
[52] U.S. Cl. ............................ 219/121.68; 219/121.74; 219/121.77; 219/121.82
[58] Field of Search ...................... 214/121.68, 121.69, 214/121.77, 121.74, 121.75, 121.78, 121.79, 121.82, 121.7, 121.71; 346/762

[56] References Cited

U.S. PATENT DOCUMENTS 4,652,722  3/1987  Stone et al. ............... 215/121.76

*Primary Examiner*—C. L. Albritton
*Attorney, Agent, or Firm*—Michael H. Wallach

[57] ABSTRACT

A laser writing apparatus includes a laser light source which directs an expanded beam of laser light onto a two-dimensional phase grating. The phase grating splits the beam into a two-dimensional array of individual bundles of collimated light or beamlets. Each individual row of beamlets is reflected by a single strip mirror toward the surface on which a pattern is to be written. By moving the surface under the beams at a selected angle, multiple parallel lines can be written simultaneously on the surface.

17 Claims, 4 Drawing Sheets

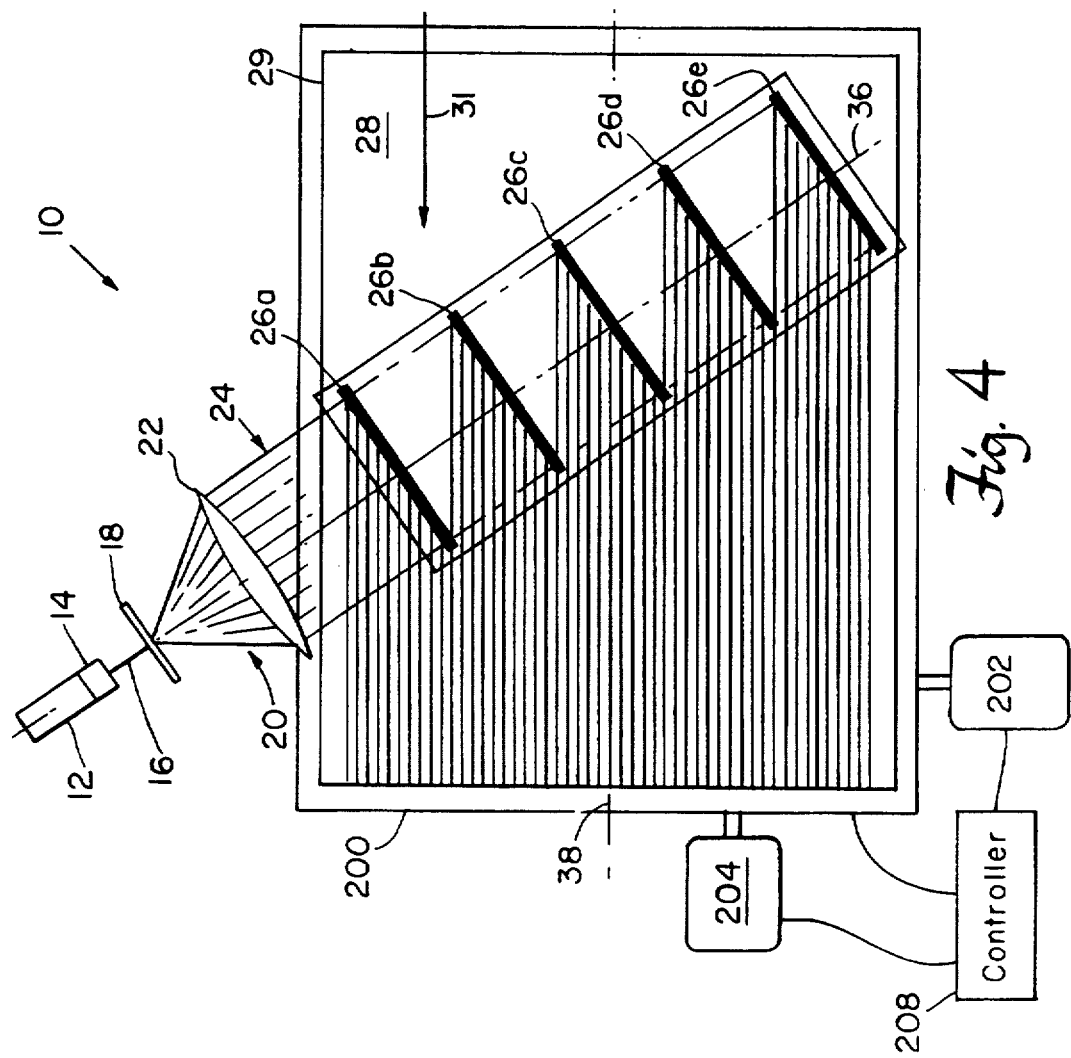

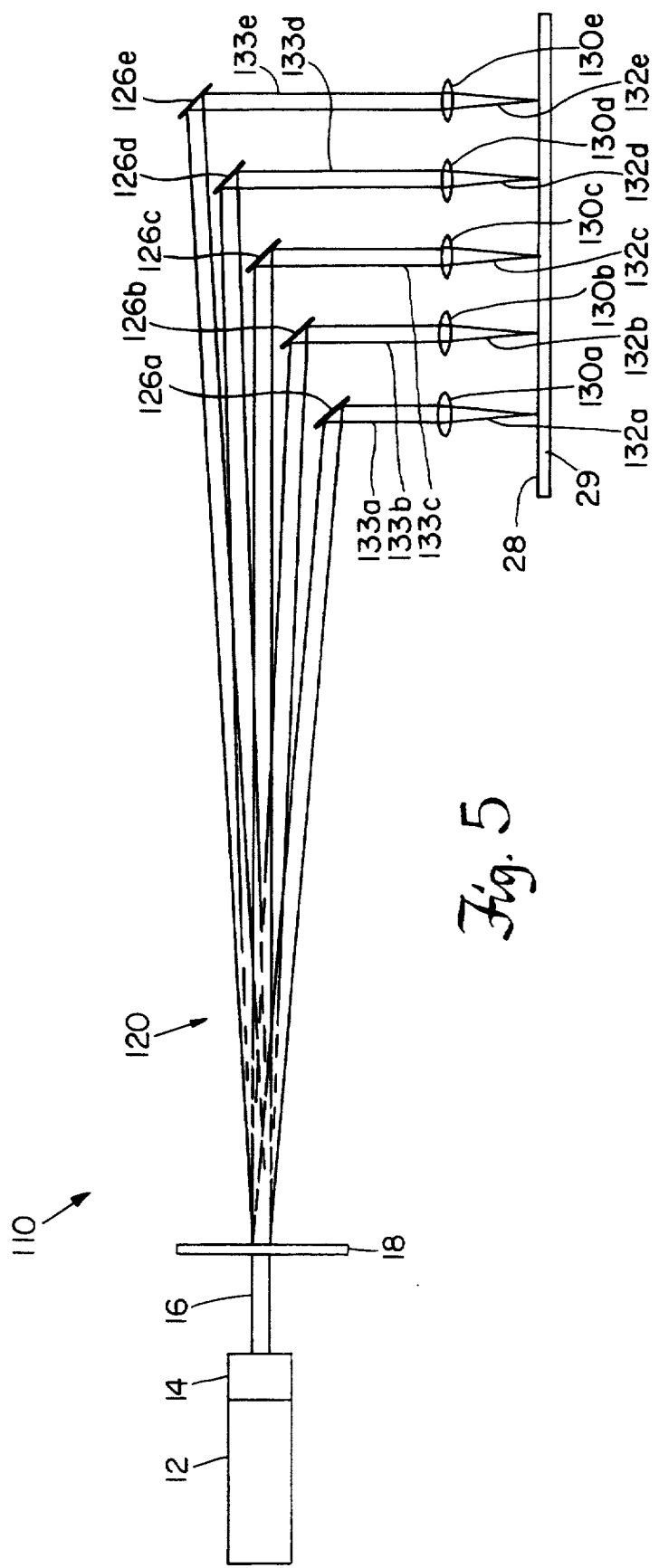

MULTIPLE-LINE LASER WRITING APPARATUS AND METHOD

BACKGROUND OF THE INVENTION

Lasers are used in many applications to write or scribe lines on surfaces. For example, laser writing on the surface of semiconductor wafers has been used to define or alter physical properties of devices formed in the wafer. The laser beam's high power and narrow beam width as well as the ability to precisely control the pattern followed by the beam on the surface make the laser ideally suited to such applications. However, where a large number of lines must be written or scribed on a surface, or in a production manufacturing environment, the use of a single laser beam to define a pattern can be very time-consuming, inefficient and, therefore, expensive.

SUMMARY OF THE INVENTION

The present invention is directed to an apparatus and method for laser writing or scribing multiple lines on a surface. The apparatus includes a laser light source which emits a beam of laser light toward a two-dimensional phase grating. The phase grating emits multiple beamlets or bundles of collimated light arranged in a two-dimensional array with respect to a plane orthogonal to the axis of propagation of the light. The bundles of light are directed to a plurality of strip fold mirrors. Each fold mirror reflects a single row of bundles toward the surface on which a pattern is to be written or scribed.

In a preferred embodiment, the source of laser light also includes a beam expander which converts a typical small diameter laser beam into a beam of greater diameter and less divergence. This in turn results in wide beamlets or bundles being transmitted toward the surface to be worked. Also, the apparatus includes multiple reimaging lenses between the fold mirrors and the surface. Each row of bundles corresponds to a row of reimaging lenses, and each bundle in a row is focused by a single reimaging lens onto the surface. The focal length selected for the reimaging lenses effects the spot size of the laser beam focused on the surface and therefore the power level of the beam striking the surface.

In a preferred embodiment, the apparatus includes a driver which moves the surface beneath the reimaging lenses as the laser light strikes the surface. The surface rests on a motion table which can be precisely controlled to move and rotate the surface as desired. By controlling the motion of the surface, a pre-determined pattern of lines can be written on the surface. As the surface is moved, each row of bundles causes a single group of equally spaced parallel lines to be written on the surface. If the surface is moved along a motion axis which forms a sufficiently large angle with the optical axis of the array of bundles, then the individual groups of parallel lines can be aligned adjacent to each other to form a single large group of equally spaced parallel lines. For a large phase grating which produces a large two-dimensional array of bundles, a very large number of parallel lines can be formed on the surface in a single writing step.

After a first set of lines is written, if the surface is then turned 90° and moved along the same motion axis under the focused laser beams, a similar set of parallel lines can be drawn across the first set. Thus, multiple rectangular shaped regions are defined on the surface. Other shapes can be defined by selecting rotation angles other than 90°.

In one embodiment, the surface on which the pattern of lines is written is the top surface of a body of material such as solar cell material. The laser light strikes the top surface with sufficient optical power to remove some of the material. Thus, the laser writing apparatus can be used to define the shape and extent of individual devices within the body of material. This is especially useful in solar cell applications where it is desirable to separate a single sheet of solar cell material into multiple smaller individual solar cells since they are more efficient than the larger single sheet. By etching lines in the top surface of the material, the individual cells are functionally separated from each other while remaining physically attached within the larger sheet of material.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 2 is a schematic illustration of a reimaging lens used in the present invention illustrating the parameters used to determine spot size of a focused beam.

FIG. 4 is a schematic top elevational view of the laser writing apparatus of FIG. 1.

FIG. 5 is a schematic side elevational view of an alternative embodiment of the laser writing apparatus of the present invention.

DETAILED DESCRIPTION OF THE INVENTION

Figure 1:
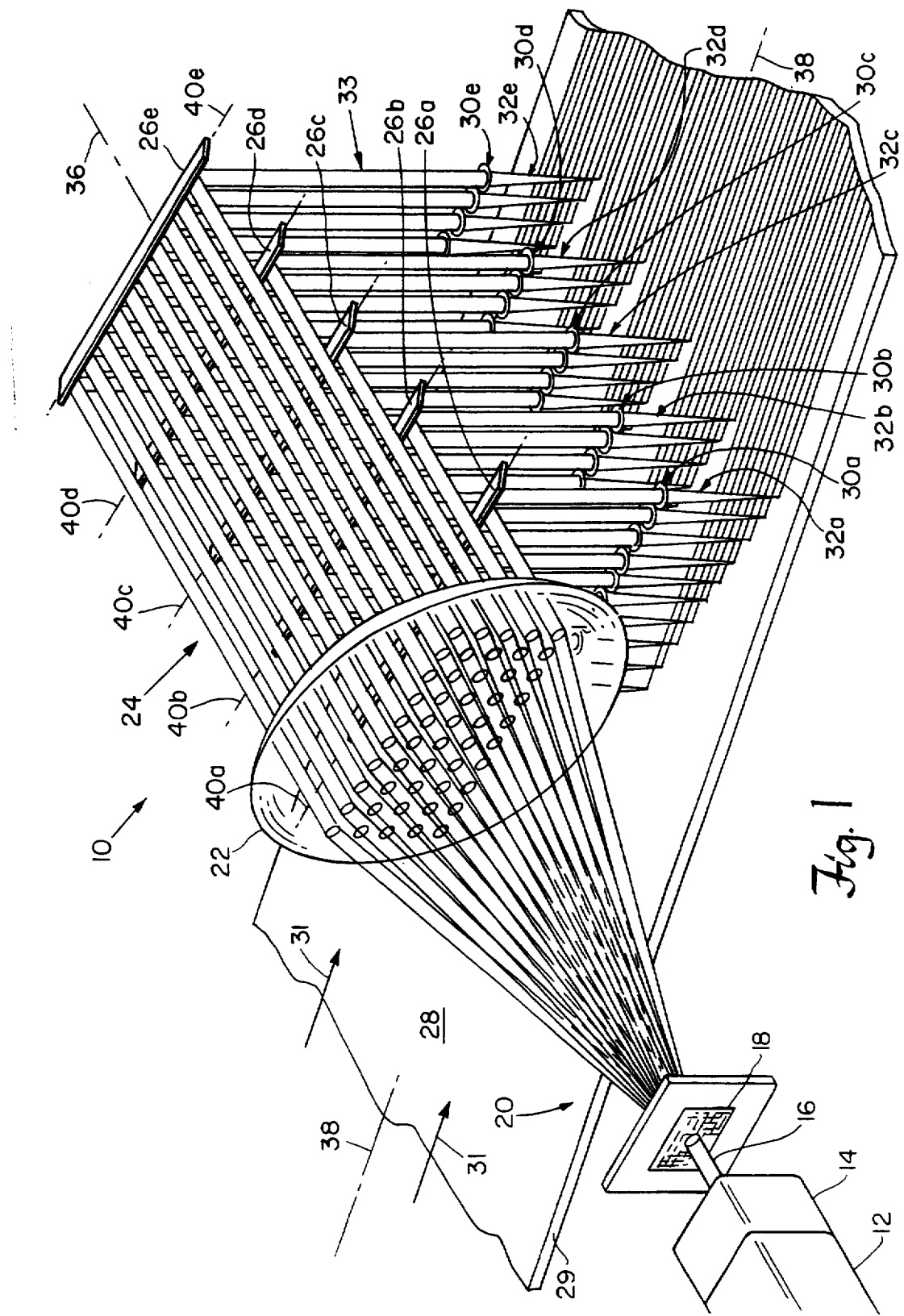
FIG. 1 is a schematic three-dimensional view of the laser writing apparatus of the invention.

FIG. 1 is a three-dimensional view of one embodiment 10 of a laser writing apparatus in accordance with the present invention. Laser light from a laser 12 is coupled to a beam expander 14. A wide beam 16 is emitted from the beam expander 14 to a two-dimensional phase grating 18. In a preferred embodiment, the beam 16 has a circular cross section of approximately 1 cm diameter. A plurality of diverging bundles of collimated light or beamlets 20 emerge from the phase grating 18 and travel toward a field lens 22. The beamlets 20 are also of circular cross section and have a diameter of approximately 1 cm. When the beamlets 20 emerge from the phase grating 18, they overlap each other. However, as they travel toward the lens 22, they continue to diverge until they separate from each other to form a two-dimensional array which in cross-section comprises rows and columns of adjacent beamlets 20.

In the embodiment shown in FIG. 1, after the beamlets 20 have become separate from each other the field lens 22 collimates the beamlets such that they cease to diverge and continue travelling parallel to each other toward a plurality of strip fold mirrors 26a–26e. It should be noted that the beams of light shown in the figure are drawn opaque to maintain clarity of the drawing. It will be understood that the light beams are not actually opaque. It will also be understood that in FIG. 1 and all of the other figures, the emphasis is placed on conveying a clear description of the invention, and not on dimensional scaling. For example, divergence of the beams emerging from the phase grating is typically shown exaggerated in order to make the illustrations clear.

Each fold mirror 26a–26e is shaped, positioned and oriented to reflect a single row in the two-dimensional array of collimated beamlets 24 toward a surface 28 of a body of material 29 on which a pattern of lines is to be written. The bottom row is reflected by fold mirror 26a, the second row from the bottom is reflected by mirror 26b, etc. It should be noted that five fold mirrors 26a–26e are shown to reflect the five rows of beamlets. However, it will be understood that the number of rows is determined by the phase grating 18 as well as the desired pattern to be written on the surface 28. If more rows are needed, a different phase grating can be used and/or more fold mirrors can be included.

Each horizontal row of collimated beamlets 24 is reflected to a row of vertical collimated beamlets 33 by its corresponding fold mirror toward a row of reimaging lenses 30. That is, the bottom row of beamlets is reflected by fold mirror 26a onto a row 30a of reimaging lenses 30, the second row from the bottom is reflected by fold mirror 26b onto row 30b of reimaging lenses 30, etc. Each lens 30 focuses a single reflected beamlet onto the surface 28. In order to maintain clarity of the illustration, the means by which the mirrors 26a–26e, phase grating 18, field lens 22 and reimaging lenses 30 are mechanically supported are not shown in FIG. 1. It will be understood that the elements of the system can be supported by any means known in the optics field.

The scribing or writing process is realized by ablation or melting of material at the surface. The material removed by ablation or melting can be a layer or portion of a layer grown on the body of material 29, or it can be a coating deposited on top of the body of material 29, or it can simply be the top of the body of material 29. In addition to removing material, the laser writing apparatus can be used in photolithographic procedures. The pattern of light impinging on the surface is used to expose a deposited layer of photoresist in a desired pattern. After the exposure, further fabrication steps such as developing and lifting off the photoresist for further processing can be carried out.

Lines are written or scribed on the surface 28 as the surface 28 is moved beneath the rows 32a–32e of focused beams. In FIG. 1, lines are written or scribed by moving the surface in the direction indicated by arrows 31. As the surface is moved, each row of focused beams 32a–32e results in a group of parallel lines 34a–34e, respectively, being written on the surface 28.

The collimated beamlets 24 propagate toward the fold mirrors 26a–26e along an axis 36. Also, the surface 28 is moved along a motion axis 38. It can be seen that a projection of the axis 36 onto the surface 28 forms an angle with the motion axis 38. This angle can be adjusted by changing the direction of motion of the surface 28 or by rotating the laser writing system 10 including laser 12, beam expander 14, phase grating 18, field lens 22, fold mirrors 26a–26e and reimaging lenses 30. Preferably, the axis of motion of the surface is changed. Changing the angle between axes 36 and 38 allows the spacing between lines in each individual group of lines and also the spacing between the groups to be adjusted. Thus, by selection of the proper angle, all of the groups of lines formed by the focused beams 32a–32e combine to form one large group of parallel lines equidistant from each other.

Further adjustment of the line spacing is also achieved by rotating the individual fold mirrors 26a–26e. Each mirror has an axis of rotation depicted as 40a–40e. To adjust the line spacing, the mirrors are rotated by known means about their respective rotation axes. The position and orientation of the reimaging lenses 30 must also then be adjusted to ensure that the beamlets are properly focused onto the surface 28.

After a first set of parallel lines is scribed on the surface 28, it can be rotated to a specified angle and then driven through the system again along the motion axis 38. During the second pass, the newly scribed lines will cross the lines made during the first pass. Thus, a two-dimensional pattern of four-sided elements is defined on the surface 28. This technique is useful in fabrication of devices such as semiconductor and/or solar cell devices. A sheet or substrate of the material, e.g., a solar cell material such as glass, is driven through the system 10 in a first step as described above to scribe a pattern of parallel lines into the coated surface of the material. The material may then be rotated approximately 90° and driven through the system 10 a second time.

Both the laser 12 and the beam expander 14 are commercially available devices. The laser 12 can be one of many types of lasers. The type of laser used is generally determined by the process being performed, i.e., ablation, melting, photolithography, etc. The output power of the laser is typically in the range of 2 to 200 watts. The beam expander 14 can be a Melles Griot LBX or LBM Series.

The amount of optical power delivered by the laser 12 to the surface 28 depends upon various factors. For example, where the body of material 29 comprises solar cell material, the function of the laser writing system 10 is generally to scribe lines on the top surface 28 in order to separate individual solar cells. In that case, sufficient power is required to remove solar cell material between devices to effectively separate them from each other. However, the depth to which material is removed must be limited so that the individual devices remain physically attached to each other.

The power delivered at the surface can be controlled by selecting the spot size of the beam where it strikes the surface 28. The spot size is determined by the physical characteristics of the reimaging lens 30 which focuses the corresponding beamlet. FIG. 2 schematically illustrates a single reimaging lens 30, a beamlet 33 impinging on the lens 30, and the resultant beam cone 32. At the vertex of the cone 32, a spot 35 is formed on the surface 28. The spot size diameter S is given by $$S = 2.4 \lambda F;$$

where
$\lambda$ is the wavelength of the light and
F is the F number of the cone 32.
F is given by $F = L/d$; where
L is the focal length of the lens 33 and
d is the effective diameter of the lens.

It is desirable that the lens 30 have a large focal length L and therefore a large corresponding F number. The longer beam cone allows for small variations in the distance between the lens 30 and the surface 28 without an appreciable variation in spot size S. In one typical embodiment, the diameter d of the reimaging lens 30 is approximately 1-2 cm, and the F number of the lens 30 is about 5 to 10.

Referring back to FIG. 1, the phase grating 18 is typically formed from a transparent substrate such as quartz glass. Various techniques can be used to produce the grating from the glass substrate. In one method, the substrate is coated with a photographic emulsion. Next, a two-dimensional mask defining the grating pattern is laid over the emulsion. The exposed portions of emulsion are then bleached to change the index of refraction of those portions. Thus, a two-dimensional periodic pattern of changing index of refraction is created on the phase grating. When a wave front strikes the grating, the differing indices of refraction result in varying optical path lengths and corresponding differing phase shifts. With the correct periodic pattern formed on the substrate, the result is a two-dimensional matrix of rows and columns of beams of light diverging from the phase grating and having essentially equal intensity. Various other methods for producing the phase grating are also available. For example, plasma etching and reactive ion etching can also be used. The various methods available for producing the phase grating, and a grating pattern which will result in the desired diverging array of equal intensity light beams are described in "Dammann Gratings for Laser Beam Shaping," in *Optical Engineering*, December, 1989, Volume 28, No. 12, pages 1267-1275, which is incorporated herein by this reference.

Figures 3A, 3B:
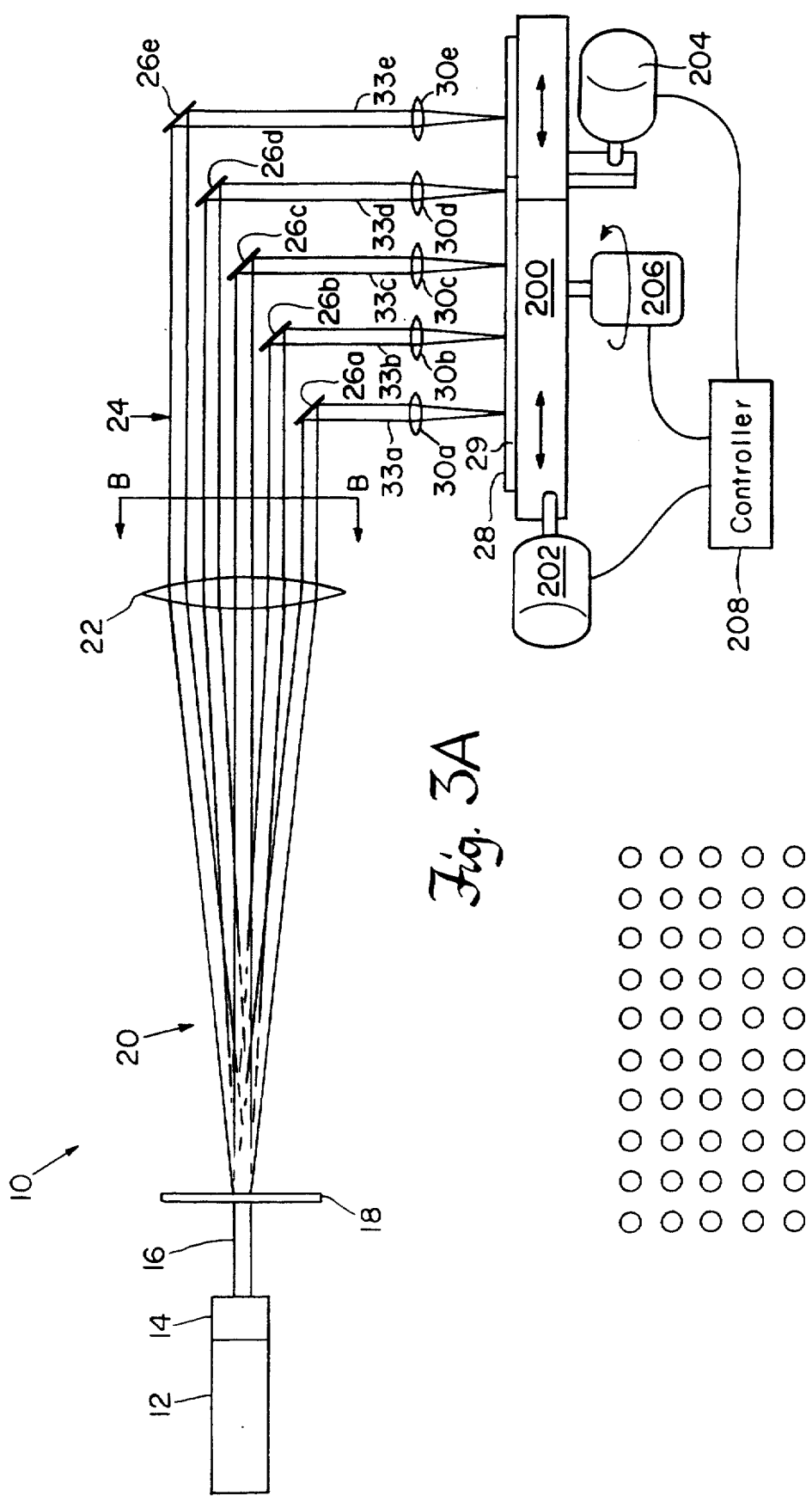
FIG. 3A is a schematic side elevational view of the laser writing apparatus of FIG. 1.
FIG. 3B is a cross-sectional view of collimated beams taken along line B—B in FIG. 3A.

FIG. 3A is a schematic side elevational view of the laser writing system 10 of the invention. Once again the laser 12 creates a laser beam which is expanded by beam expander 14. The expanded beam 16 strikes phase grating 18 which generates the plurality of diverging bundles or beamlets 20. The field lens 22 collimates the beams into collimated beamlets 24. Each row of beamlets is reflected by a strip fold mirror 26a-26e toward the surface 28 of the body of material 29 upon which a pattern is written. Each reflected beamlet 33a-33e is reimaged by a reimaging lens 30a-30e, respectively. The focused beams or cones 32a-32e strike the surface 28 to generate the pattern of lines.

FIG. 3A also schematically depicts the driver apparatus of the invention. The body of material 29 is mounted on a positioning table 200 which is simultaneously movable in two orthogonal dimensions in the plane of the surface 28 of the material 29. A first motor 202 imparts motion in a first dimension to the table; a second motor 204 drives the table 200 in the orthogonal dimension. A controller 208 controls the motors 202, 204 to provide the desired motion of the material 29 such that the desired pattern is written on the surface 28. A third motor 206, also controlled by the controller 208, imparts rotational motion to the table 200. As described above, the material 29 may be rotated between writing steps such that a pattern of crossing lines can be written. It should be noted that the motors 202, 204, 206 and controller 208 are depicted schematically for the purpose of clearly illustrating movement of the material. It will be understood that these devices need not be individual units as they are shown.

FIG. 3B is a schematic cross-section of the collimated beamlets 24 between the field lens 22 and the fold mirrors 26a-26e taken along line B—B of FIG. 3A. The view shows the two-dimensional array of rows and columns of beamlets 24.

FIG. 4 is a schematic top view of the system of FIG. 1. From this view it can clearly be seen that the proper selection of the angle between the axis 36 along which the collimated beams 24 travel and the axis 38 along which the body of material 29 is moved results in a pattern of multiple equally spaced parallel lines being written on the surface 28. It can be seen that varying the angle will result in changing the distance between each group of lines produced by the fold mirrors as well as the distance between each individual line within a group. Varying the angle is accomplished via the controller 208 commanding the drive motors 202 and 204. Varying the relative amount of motion provided by each motor to the table 200 causes the angle between axis 36 and 38 to change, thus changing the spacing between the parallel lines written on the surface.

FIG. 5 shows an alternative embodiment 110 of the invention. In this embodiment, the field lens 22 has been eliminated. Therefore, the beamlets 120 continue to diverge until they impinge upon the strip fold mirrors 126a-126e. In this embodiment, because the beams are not collimated as they strike the fold mirrors 126a-126e, the distances between the groups of lines written on the surface 28 will vary. This can be compensated for by individually adjusting the tilt of each mirror 126a-126e to ensure that the distance between sets of lines remains constant. The varying tilt of the fold mirrors 126c-126e to compensate for the diverging beamlets 120 is depicted in the drawing.

As in the previous embodiment, rows of beamlets 120 each strike a single corresponding strip fold mirror which reflects the beamlets toward reimaging lenses 130a-130e. For example, the bottom row is reflected by mirror 126a into a row of reflected beamlets 133a toward a row of lenses 130a which focus the beamlets 133a into a row of focused beams 132a which strike the surface 28.

In addition to writing lines on a surface, the present invention can also be used to project a pattern of light onto a large surface. The embodiment of the system shown in FIG. 1 can be modified to accomplish this. Referring to FIG. 1, in order to project a pattern onto the surface 28, a mask for each beamlet would be placed following fold mirrors 26 such that each lens 30 forms an image of its corresponding mask on the body of material 29. Each mask selectively blocks portions of a beamlet to define a portion of the desired pattern to be projected onto the surface. In this embodiment, the lenses 30 are projection lenses located between each mask and the surface beneath it in order to focus the pattern onto the surface. Typically, this process would be used to expose a selected pattern of photoresist deposited on the surface.

To create the pattern on the surface, the body of material 29 is not moved continuously as it is in the laser writing embodiment. Instead, the pattern is formed by executing a series of alternating exposure and movement steps (step and repeat). First the laser is activated to expose a portion of the surface as the surface remains stationary. After the exposure, the surface is stepped to a next location. The surface is then exposed again through the masks at the new location. This process continues until the desired overall pattern is exposed on the surface. The photoresist is then developed and lifted off to leave the desired pattern of hardened developed photoresist on the surface. Subsequent processing can then be carried out on the surface.

This process is especially applicable to creating large repetitive patterns on extended display panels such as flat panel displays. In flat panel displays, the large repetitive patterns are used to fabricate the individual pixels of a display as well as the associated circuitry required to address and drive the pixels.

While this invention has been particularly shown and described with references to preferred embodiments thereof, it will be understood by those skilled in the art that various changes in form and details may be made therein without departing from the spirit and scope of the invention as defined by the appended claims.

The invention claimed is:

1. An apparatus comprising:
    a laser light source for emitting a beam of laser light;
    a two-dimensional phase grating for receiving the beam of laser light from the source and dividing the beam of laser light into multiple bundles of light arranged in a two-dimensional array comprising rows of bundles of light; and
    a plurality of mirrors for receiving the bundles of light, each mirror being positioned to reflect light from a single row of the bundles of light toward a surface.

2. The apparatus of claim 1 wherein the source of laser light comprises a beam expander such that the beam of laser light is a wide beam.

3. The apparatus of claim 1 further comprising a plurality of lenses between the mirrors and the surface, each lens focusing a bundle of light onto the surface.

4. The apparatus of claim 1 further comprising a driver for moving the surface with respect to the bundles of light to define a pattern of laser light on the surface.

5. The apparatus of claim 4 wherein the driver moves the surface such that each row of bundles of light causes a group of parallel lines to be written on the surface.

6. The apparatus of claim 1 further comprising a driver for moving the surface such that each row of bundles of light causes a group of parallel lines to be written on the surface.

7. The apparatus of claim 1 wherein the surface is a top surface of a body of solar cell material.

8. The apparatus of claim 7 wherein the light from the bundles of light impinges on the surface with sufficient power to remove solar cell material such that lines written on the surface define physical extents of individual solar cells in the body of material.

9. The apparatus of claim 1 wherein the surface is a top surface of a body of material, the light impinging on the surface with sufficient power to remove material of the body of material.

10. An apparatus for laser scribing multiple parallel lines on a surface of a body of material, comprising:
    a laser light source for emitting a wide beam of laser light;
    a two-dimensional phase grating for receiving the beam of laser light from the source and dividing the beam of laser light into multiple bundles of light arranged in a two-dimensional array comprising rows of bundles of light;
    a plurality of mirrors for receiving the bundles of light, each mirror being positioned to reflect light from a single row of the bundles of light toward the surface;
    a plurality of lenses between the mirrors and the surface, each lens focusing a bundle of light onto the surface; and
    a driver for moving the body of material with respect to the bundles of light as the light impinges on the surface.

11. The apparatus of claim 10 wherein:
    the body of material comprises solar cell material; and
    lines scribed on the surface of the body of material define physical extents of individual solar cells within the body of material.

12. The apparatus of claim 10 wherein the light impinging on the surface is of sufficient power to remove material from the body of material.

13. A method of laser writing on a surface, comprising:
    coupling a beam of laser light from a laser light source to a two-dimensional phase grating, the two-dimensional phase grating dividing the beam of laser light into a plurality of bundles of light arranged in a two-dimensional array comprising rows of bundles of light; and
    coupling the bundles of light to a plurality of mirrors, each mirror being positioned to reflect a single row of bundles of light toward the surface;
    focusing each reflected bundle of light onto the surface; and
    moving the surface with respect to the bundles of light to define a pattern to be written on the surface.

14. The method of claim 13 wherein the surface is moved such that each row of bundles of light causes a group of parallel lines to be written on the surface.

15. The method of claim 13 wherein the surface is the top surface of a body of solar cell material.

16. The method of claim 15 wherein the light focused onto the surface is of sufficient power to remove solar cell material from the body of solar cell material such that the pattern written on the surface defines physical extents of individual solar cells within the body of solar cell material.

17. The method of claim 13 wherein:
    the surface is the top surface of a body of material; and
    the light focused onto the surface is of sufficient power to remove material from the body of material.

* * * * *